United States Patent
Guo et al.

(10) Patent No.: US 7,760,037 B2
(45) Date of Patent: Jul. 20, 2010

(54) PROCESS, VOLTAGE, AND TEMPERATURE COMPENSATED CLOCK GENERATOR

(75) Inventors: Xinwei Guo, Waigaoqiao (CN); Gerald J. Barkley, Oregon, WI (US); Jun Xu, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 256 days.

(21) Appl. No.: 11/692,325

(22) Filed: Mar. 28, 2007

(65) Prior Publication Data

US 2008/0238518 A1 Oct. 2, 2008

(51) Int. Cl.
*H03K 3/26* (2006.01)

(52) U.S. Cl. ............. 331/111; 331/143; 331/74; 331/36 C; 365/222

(58) Field of Classification Search ................. 331/111, 331/143, 36 C, 74; 365/222
See application file for complete search history.

(56) References Cited

U.S. PATENT DOCUMENTS

| 5,497,127 | A | * | 3/1996 | Sauer | 331/17 |
| 6,052,035 | A | * | 4/2000 | Nolan et al. | 331/74 |
| 6,348,842 | B1 | * | 2/2002 | Raina et al. | 331/176 |
| 2006/0226922 | A1 | * | 10/2006 | Rajagopal et al. | 331/143 |

* cited by examiner

*Primary Examiner*—Arnold Kinkead
(74) *Attorney, Agent, or Firm*—Trop, Pruner & Hu, P.C.

(57) ABSTRACT

According to some embodiments, a process, voltage, and temperature compensated clock generator is disclosed. The clock generator may be a charge-charge clock generator including a first load capacitive element and a second load capacitive element. A process, voltage, and temperature compensated current source is coupled to the charge-charge clock generator, and is used to charge the first load capacitive element and the second load capacitive element.

3 Claims, 2 Drawing Sheets

PROCESS, VOLTAGE, AND TEMPERATURE COMPENSATED CLOCK GENERATOR

BACKGROUND

On-die clock generators may have large variations across different process, voltage, and temperature corners. To reduce the clock variations, a trim by die method is used, which can be complex and time consuming during testing.

BRIEF DESCRIPTION OF THE DRAWINGS

A better understanding of embodiments of the present invention can be obtained from the following detailed description in conjunction with the following drawings, in which.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure an understanding of this description.

References to "one embodiment", "an embodiment", "example embodiment", "various embodiments", etc., indicate that the embodiments) of the invention so described may include particular features, structures, or characteristics, but not every embodiment necessarily includes the particular features, structures, or characteristics. Further, some embodiments may have some, all, or none of the features described for other embodiments.

In the following description and claims, the terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

As used in the claims, unless otherwise specified the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The term "wireless" and its derivatives may be used to describe circuits, devices, systems, methods, techniques, communications channels, etc., that communicate data by using modulated electromagnetic radiation through a non-solid medium. The term does not imply that the associated devices do not contain any wires, although in some embodiments they might not. The term "mobile wireless device" is used to describe a wireless device that may be in motion while it is communicating.

According to some embodiments, a low power on-chip clock generator to compensate for process, voltage, and temperature (PVT) variation is disclosed. The PVT compensated clock generator generates a stable clock for a synchronous digital circuit.

Figure 1:
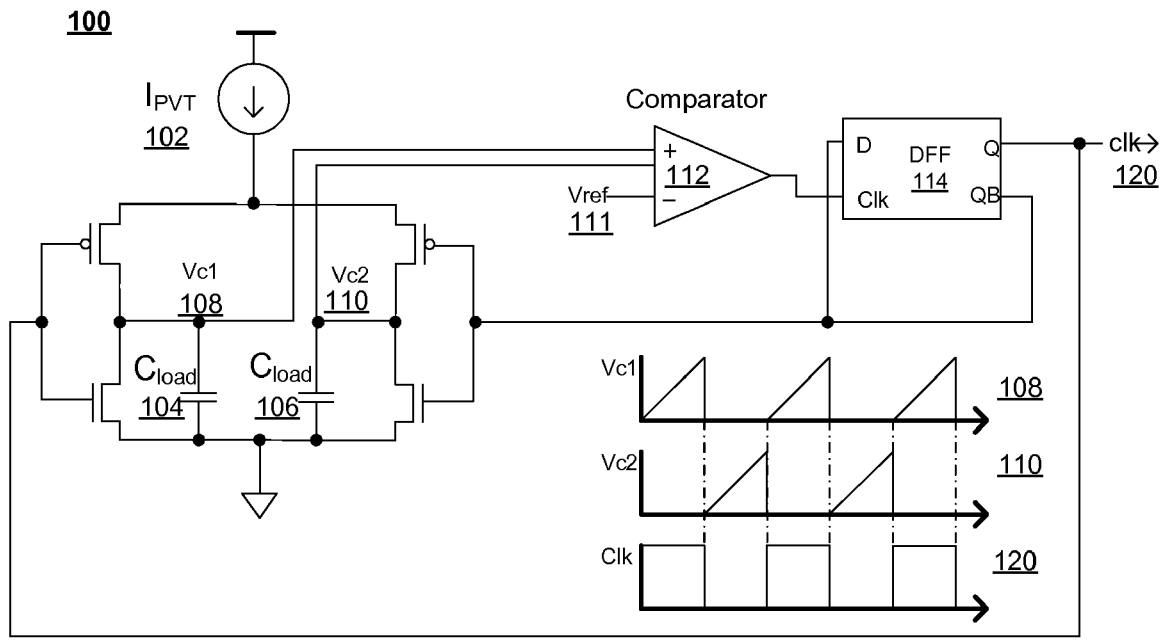
FIG. 1 is an illustration of a charge-charge clock generator according to some embodiments.

FIG. 1 is an illustration of a charge-charge clock generator 100 according to some embodiments. The clock generator 100 uses a process, voltage, and temperature compensated current source, $I_{PVT}$, 102, to charge the load capacitive elements, $C_{load}$ 104, 106. Each capacitive load element 104, 106 is coupled to a comparator 112. In some embodiments, the load capacitive elements may be capacitors.

The comparator 112 compares the charging voltages, $V_{c1}$ 108 and $V_{c2}$ 110, to a reference voltage, $V_{ref}$ 111. In some embodiments, the reference voltage 111 may be a process, voltage, and temperature independent reference voltage.

The output of the comparator 112 is coupled to a D-flip flop 114. As the current source 102 charges and discharges the capacitive loads 104, 106, the D-flip flop 114 is switched to generate a stable process, voltage, and temperature independent clock 120.

As load capacitance 104 charges and the voltage at node 108 increases, while the voltage at node 110 is zero, the clock 120 is high. When load capacitance 104 is discharged and the voltage at node 108 is zero, while load capacitance 106 charges and the voltage at node 110 increases, the clock is low.

The clock period may be described by the following equation:

$$T = 2 * C_{Load} * \frac{V_{ref}}{I_{PVT}}$$

Figure 2:
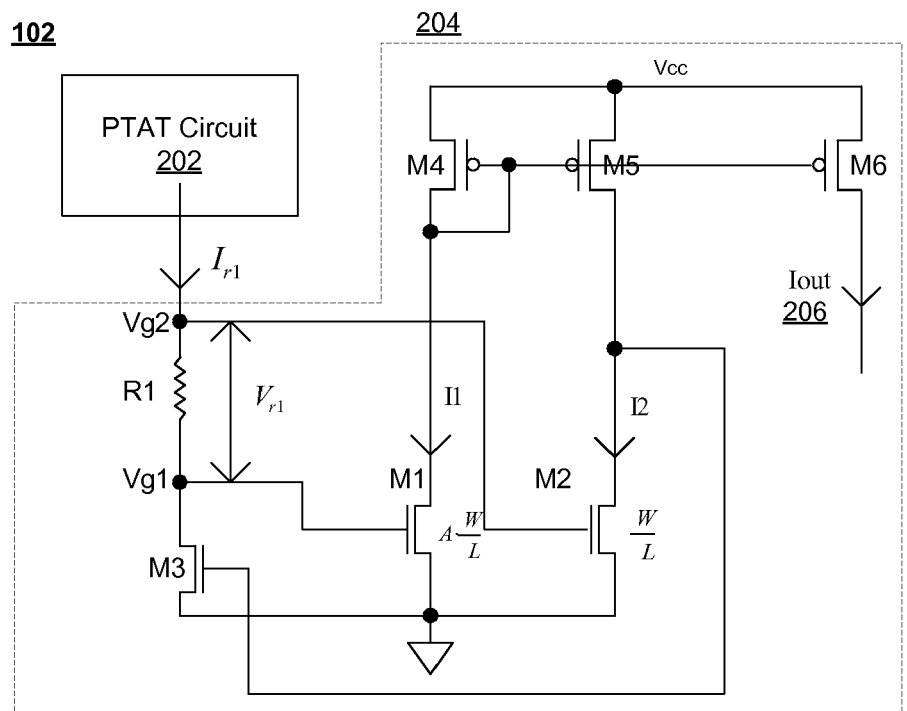
FIG. 2 is an illustration of a process and voltage compensated current source according to some embodiments.

FIG. 2 is illustration of the process, voltage, and temperature compensated current source, $I_{PVT}$, 102 of FIG. 1. The current source 102 includes a proportional to absolute temperature (PTAT) circuit 202 coupled to current mirror circuitry 204 that has a low sensitivity to process and voltage supply variation.

In the current mirror circuitry 204, transistor M1 has a W/L (channel width/channel length) ratio that is 'A' times larger than that of M2. The values for W and L may be chosen as long and wide channel to minimize the process variation.

Vg1 and Vg2 are the gate voltages of M1 and M2, respectively. M4, M5, and M6 are current mirrors. Negative feedback through M3 stabilizes the circuit.

The currents I1 and I2 may be expressed by the following equations, where U is mobility:

$$I_1 = \frac{1}{2} A \left( \frac{W}{L} \right) U \, C_{ox} (V_{g1} - V_t)^2$$

$$I_2 = \frac{1}{2} \left( \frac{W}{L} \right) U \, C_{ox} (V_{g2} - V_t)^2$$

When the circuit is in a stable condition, $I_{out}$ 206 is equal to the following, where $V_{r1}$ is the voltage across resistor R1:

$$I_{out} = I_1 = I_2 = \frac{1}{2} A \left( \frac{W}{L} \right) U \, C_{ox} \left( \frac{V_{r1}}{\sqrt{A}-1} \right)^2$$

Thus, $I_{out}$ 206 is independent of process and voltage supply. Only the mobility, U, and voltage, $V_{r1}$, vary with temperature.

The temperature variation of $V_{r1}$ can be controlled through circuit design. Since mobility has a negative temperature coefficient, use of a PTAT reference voltage, $V_{r1}$, can compensate for any variation in mobility, U, due to temperature.

Figure 3:
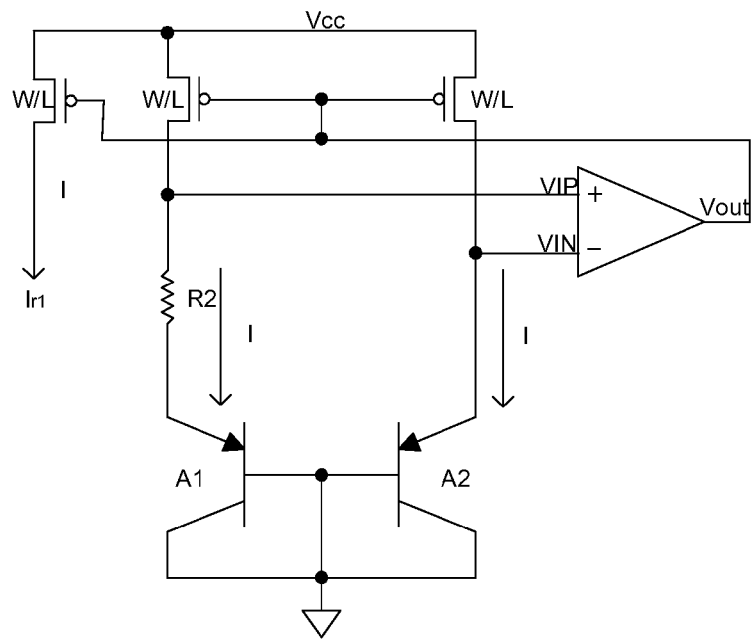
FIG. 3 is an illustration of a proportional to absolute temperature (PTAT) current source according to some embodiments.

FIG. 3 illustrates the PTAT circuit 202 of FIG. 2, according to some embodiments. A1 and A2 are bipolar transistors. The size of A1 may be larger than the size of A2. In a stable condition, there is a voltage drop across resistor R2. The current, I, is:

$$I = \frac{1}{R_2}\frac{kT}{q}\ln\left(\frac{A_1}{A_2}\right)$$

I is the current $I_{r1}$ of FIG. 2, thus:

$$V_{r1} = I_{r1} * R_1 = \frac{R_1}{R_2}\frac{kT}{q}\ln\left(\frac{A_1}{A_2}\right)$$

Using the same type of resistive element for R1 and R2 may allow a stable ratio of R1/R2. Thus, $V_{r1}$ will be proportional to temperature and insensitive to any process and/or voltage variation.

Thus, referring back to FIG. 1, the current source, $I_{PVT}$, 102 may be described by the equation:

$$I_{out} = \frac{1}{2}A\left(\frac{W}{L}\right)U\,C_{ox}\left(\frac{1}{(\sqrt{A}-1)}\frac{R_1}{R_2}\frac{kT}{q}\ln\left(\frac{A_1}{A_2}\right)\right)^2$$

In the above equation, A is the device size ratio between a transistor pair in the current source (FIG. 2), W and L are the channel width and length for the transistors (FIG. 2), U is mobility, $R_1$ and $R_2$ are the values of the resistive elements in the current source (FIG. 2, FIG. 3), and A1 and A2 are the areas of the bipolar transistors used in the PTAT circuit (FIG. 3).

Since $C_{load} = C_{ox}*(WL)_{Load}$, the clock period can be rewritten as:

$$T = 4\frac{V_{ref}(WL)_{Load}}{A\left(\frac{W}{L}\right)U\left(\frac{1}{\sqrt{A}-1}\frac{R_1}{R_2}\frac{kT}{q}\ln\left(\frac{A_1}{A_2}\right)\right)^2}$$

Thus, according to some embodiments, the clock period may be independent of process, voltage, and temperature by careful selection of design parameters as given in the above formula. The charge-charge clock generator 100 provides a stable clock 120. The clock period does not vary with process, voltage, and/or temperature. Thus, the clock may be more reliable at higher clock frequencies.

Figure 4:
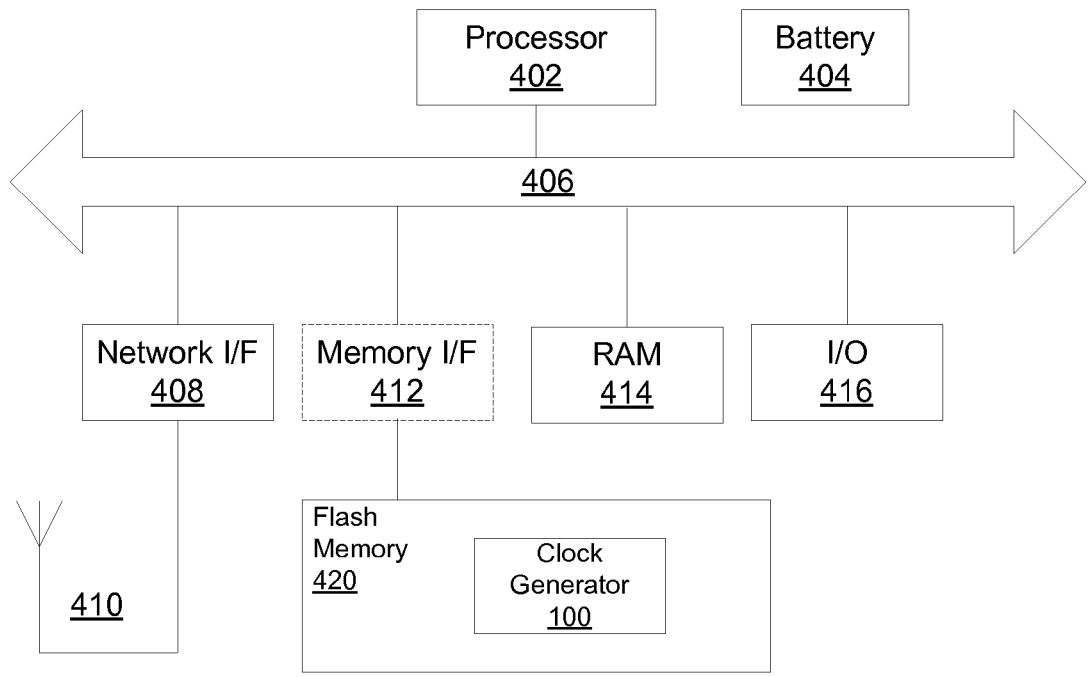
FIG. 4 is a block diagram of a system according to some embodiments.

FIG. 4 is a block diagram of a system according to some embodiments. In some embodiments, the system may be a mobile wireless device.

The system may include a controller 402 which communicates via an interconnect 406. The controller 402 may be a microcontroller, one or more microprocessors, each of which may include one or more cores, a digital signal processor (DSP), or another type of controller. The system may be powered by a battery 404 or may be powered with another power source, such as AC power.

A variety of input/output (I/O) devices 416 may be coupled to the interconnect 406. The I/O devices may include items such as a display, keyboard, mouse, touch screen, or other I/O devices. A wireless network interface 408 including an antenna 410 may also be coupled to the interconnect 406. The wireless interface 408 may enable cellular or other wireless communication between the system and other devices. In one embodiment, the antenna 410 may be a dipole antenna.

The system also includes a non-volatile memory device 420, such as, but not limited to, a NOR type flash memory device. The memory device may be built into the system, or may be part of a removable storage medium, such as a card form factor, that may be inserted into an optional card interface 412 or other type of interface.

The memory device 420 may include a process, voltage, and temperature compensated clock generator 100, such as, for example, the clock generator circuit illustrated and described above with respect to FIGS. 1-3. The memory device may also include other well known elements not illustrated here for the sake of clarity, such as, for example, a memory array, control logic, and other elements.

Thus, a process, voltage, and temperature compensated clock generator is disclosed in various embodiments. In the above description, numerous specific details are set forth. However, it is understood that embodiments may be practiced without these specific details. In other instances, well-known circuits, structures, and techniques have not been shown in detail in order not to obscure the understanding of this description. Embodiments have been described with reference to specific exemplary embodiments thereof. It will, however, be evident to persons having the benefit of this disclosure that various modifications and changes may be made to these embodiments without departing from the broader spirit and scope of the embodiments described herein. The specification and drawings are, accordingly, to be regarded in an illustrative rather than a restrictive sense.

We claim:

1. A system comprising:
   an interconnect;
   a processor coupled to the interconnect;
   a NOR flash memory device coupled to the interconnect, wherein the memory device includes a charge-charge clock generator having a first load capacitive element and a second load capacitive element and a current source coupled to the charge-charge clock generator, wherein the current source is process, voltage, and temperature compensated, and is used to charge the first load capacitive element and the second load capacitive element; and
   wherein the charge-charge clock generator further includes a comparator coupled to the first load capacitive element and the second load capacitive element to compare a first charging voltage and a second charging voltage to a process, voltage, and temperature independent reference voltage, wherein the comparator has an output coupled to a D type flip-flop producing the clock generator output.

2. The system of claim 1, wherein the current source includes process and voltage compensated current minor circuitry coupled to a proportional to absolute temperature (PTAT) current source.

3. The system of claim 1, wherein the charge-charge clock generator is capable of generating a clock having a clock period that is independent of process, voltage, and temperature.

* * * * *